United States Patent

Shue et al.

[11] Patent Number: 6,083,835
[45] Date of Patent: Jul. 4, 2000

[54] SELF-PASSIVATION OF COPPER DAMASCENE

[75] Inventors: Shau-Lin Shue, Hsinchu; Chen-Hua Yu, Hsin-Chu, both of Taiwan

[73] Assignee: Taiwan Semiconductor Manufacturing Company, Hsin-Chu, Taiwan

[21] Appl. No.: 09/121,707

[22] Filed: Jul. 24, 1998

[51] Int. Cl.$^7$ .................................... H01L 21/44
[52] U.S. Cl. .................. 438/687; 438/626; 438/692; 438/618; 438/622; 438/674; 438/675; 438/680
[58] Field of Search .................... 438/626, 687, 438/692, 618, 622, 674, 675, 680

[56] References Cited

U.S. PATENT DOCUMENTS

| | | | |
|---|---|---|---|
| 5,173,442 | 12/1992 | Carey | 437/173 |
| 5,380,546 | 1/1995 | Krishnan et al. | 427/126.1 |
| 5,451,551 | 9/1995 | Krishnan et al. | 437/241 |
| 6,004,188 | 12/1999 | Roy | 451/41 |

*Primary Examiner*—David Nelms
*Assistant Examiner*—Quoc Hoang
*Attorney, Agent, or Firm*—George O. Saile; Stephen B. Ackerman

[57] ABSTRACT

A process for forming damascene wiring within an integrated circuit is described. After the trenches have been filled and planarized, normal dishing of the copper is present. This is then eliminated by depositing a layer of a chrome-copper alloy over the damascene wiring and then planarizing this layer so that it covers only the copper in the damascene trench. Then, while the IMD is deposited, some of the chromium in the alloy gets selectively oxidized, resulting in a self-aligned barrier layer of chromium oxide at the copper to IMD interface.

19 Claims, 1 Drawing Sheet

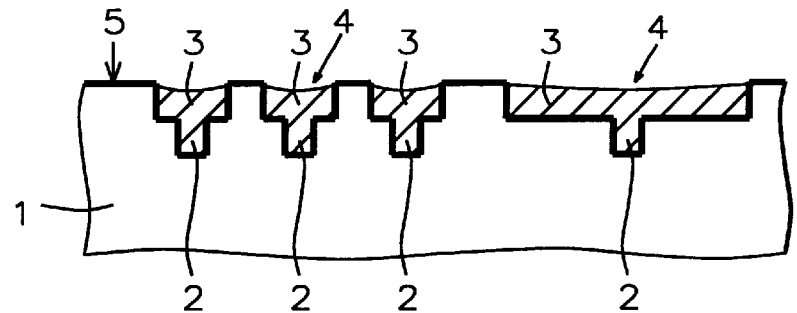
FIG. 1 - Prior Art
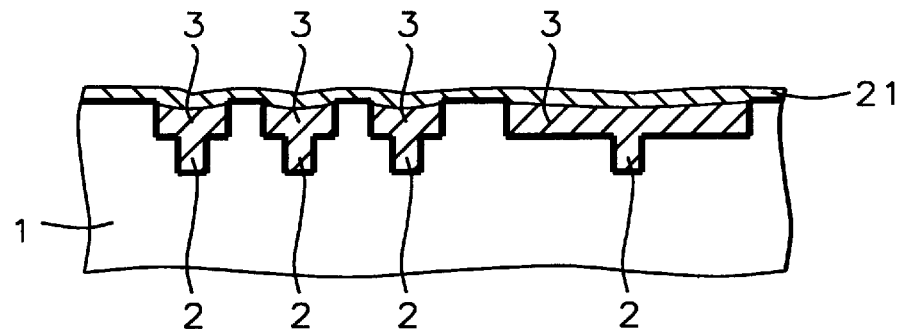
FIG. 2
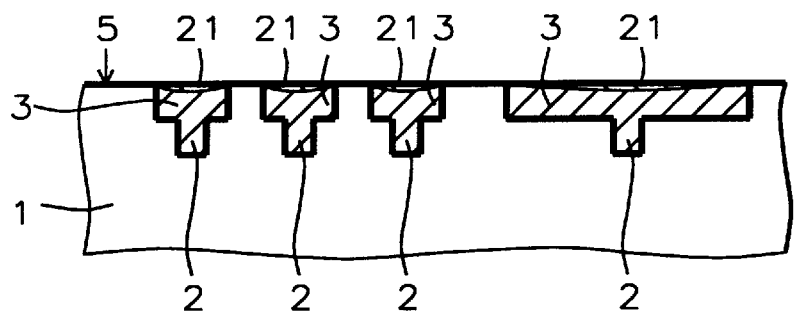
FIG. 3
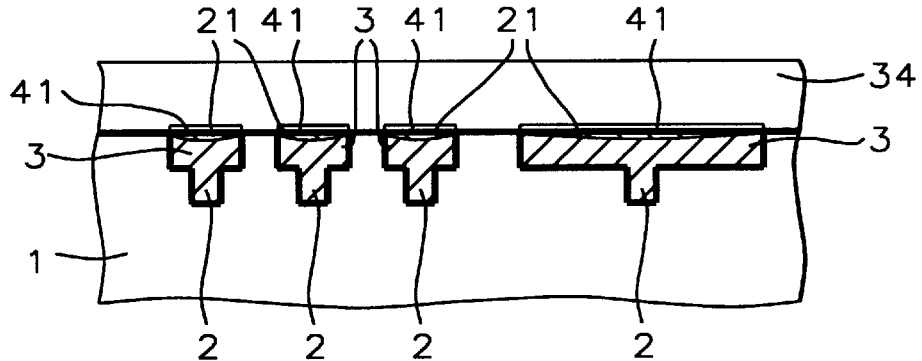
FIG. 4

SELF-PASSIVATION OF COPPER DAMASCENE

FIELD OF THE INVENTION

The invention relates to the general field of integrated circuits with particular reference to damascene wiring and methods for eliminating dishing and providing an isolation barrier for the copper.

BACKGROUND OF THE INVENTION

The term damascene when used in connection with integrated circuit wiring, refers to the fact that a layer has been inlaid within a supporting medium, as opposed to being covered by it. The main advantage of this approach to wiring is that it is highly cost effective relative to conventional wiring. The word 'damascene' is derived from the city of Damascus where inlaid jewelry of this general format was first produced. In the present invention, the area for receiving the inlaid conductor is formed in two separate steps so the process is more correctly termed 'dual damascene' but we shall use 'damascene' and 'dual damascene' interchangeably.

Copper is the metal most widely used in damascene technology, because of its excellent electrical conductivity. Unfortunately, copper is also a rapid diffuser, particularly into silicon where its presence plays havoc with the semiconducting properties of that material. Accordingly it is necessary to surround all copper wiring with a diffusion barrier to isolate it from the remainder of the integrated circuit. Where no electrical contact between the wiring and the circuit is required, the barrier may be an insulator but when electrical contact must be made the barrier must also be an electrical conductor.

An example of damascene wiring (shown in schematic cross-section) is given in FIG. 1. The wiring is composed of two parts, both of which extend downwards from the surface of dielectric 1. The main part of the wiring (in the sense that it is always present) is trench 3. The second part is cavity, or via hole, 2 that is present whenever contact needs to be made between the wiring and some other layer (not shown in this example). Once 2 and 3 have been formed (generally in two steps but not necessarily, as mentioned below) their sidewalls are coated with a barrier layer material such as tantalum, tantalum nitride, or titanium nitride. They are then overfilled with copper, following which the surface is planarized so that no copper remains on the original surface 5 of dielectric layer 1.

Unfortunately, because it is much softer then the dielectric, the copper gets removed somewhat faster and the result is dishing of the copper across the mouths of trenches 3. Dishing is undesirable because it reduces the conductive cross-section of the wire. Additionally, in order to minimize the amount of dishing, the planarization process is often terminated somewhat prematurely so a thin layer of copper gets left behind on the surface of the dielectric.

At the completion of planarization, a second barrier layer is laid down to isolate the top surface of the wiring. Silicon nitride is widely used for this purpose. While silicon nitride is an effective barrier layer, it does have a tendency to react with the copper because of the latter's reaction to the ammonia that is present during the former's deposition.

Thus, two improvements over the state of the art are needed. These are a trench filling and planarization technique that does not lead to dishing or copper residues and a barrier layer that does not react adversely with the copper. The present invention addresses both these issues.

In a search of the prior art we were unable to find any references that teach the method of the present invention. Some references were, however, found to be of interest. For example, Carey (U.S. Pat. No. 5,173,442 December 1992) describes a method for forming a damascene connector using relatively few process steps. The vias are first etched using a combination of hard and soft masking. The latter gets consumed as the via forms and, once it is gone, etching of both the trench and the via proceed simultaneously, as determined by the hard mask alone.

Krishnan et al. (U.S. Pat. No. 5,451,551 September 1995) teaches a damascene process in which a first barrier layer is deposited on the trench walls and the trench is then only partially filled with copper. The trench is then overfilled with material of a second barrier layer so that, after CMP, the top surface of the copper is protected by said second barrier layer. This patent is a divisional of an earlier patent (U.S. Pat. No. 5,380,546 January 1995) by the same authors and is very close to same.

SUMMARY OF THE INVENTION

It has been an object of the present invention to provide a process for implementing damascene wiring within an integrated circuit.

A further object of the invention has been that said process provide a trench filling and planarization technique that does not result in a dish shaped interface between the copper and the IMD layer.

A still further object has been that said process not result in the presence of a copper residue on the surface between wiring channels.

Another object has been that the barrier layer formed as part of said process be self-aligned and not react adversely with the copper.

These objects have been achieved by depositing a layer of a chrome-copper alloy over the damascene wiring and then planarizing this layer so that it covers only the copper in the damascene trench. Then, while the IMD is deposited, some of the chromium in the alloy is selectively oxidized resulting in a self-aligned barrier layer of chromium oxide at the copper to IMD interface.

BRIEF DESCRIPTION OF THE DRAWINGS

FIG. 1 a cross-section of an area containing damascene wiring, illustrating how dishing of the upper copper surface can occur.

FIG. 2 shows the deposition of a layer of chrome-copper alloy over the damascene wiring seen in FIG. 1.

FIG. 3 shows the appearance of the structure of FIG. 2 after it has been planarized.

FIG. 4 illustrates how a self-aligned barrier layer gets formed at the IMD to alloy interface.

DESCRIPTION OF THE PREFERRED EMBODIMENTS

The process of the present invention begins with the formation of copper damascene wiring. This is to be formed within a dielectric layer 1 (see FIG. 1) which is the topmost layer of a partially completed integrated circuit (not shown). Layer 1, usually a CVD oxide, is patterned, using standard photolithographic techniques, and then etched, first to form trench 3 in the upper surface of 1 and then again to form cavity 2 that is centrally located within trench 3. As indicated earlier, it is also possible to etch the trench and the cavity in reverse order. This has no bearing on the outcome of the process of the present invention.

A barrier layer of tantalum or tantalum nitride (not shown) is then deposited over all exposed surfaces, including the surface of layer 1 and the walls of trench 3 and cavity 2. This was followed by the deposition of a nucleating (or seed) layer of copper (also not shown) over the barrier layer at all the same surfaces.

The trench and cavity are now overfilled with copper. The surface is then planarized, causing removal of copper until its surface is flush with surface 5, the original surface of layer 1, resulting in the removal of any barrier layer material that was on the surface of 1. As discussed above, the net result of all this is that dishing of the surface of the copper in the trenches (as pointed to by arrows 4) will have occurred.

We noted earlier that, in prior art practice, planarization may inadvertently be terminated too soon (to minimize dishing) resulting in the presence of copper traces on surface 5. As part of the process of the present invention, planarization is allowed to proceed until it is certain that no copper remains on 5. Although this may lead to additional dishing of the copper, the outcome of the process of the present invention is not affected by this.

Referring now to FIG. 2, in a key feature of the present invention, a layer of chrome-copper alloy 21 is deposited over the surface of the dielectric layer 1 as well as the top surface of the damascene wiring trench 3 to a thickness between about 500 and 3,000 Angstroms. Deposition of the chrome-copper may be achieved by any of several methods, including chemical vapor deposition, physical vapor deposition, or electroplating. The chrome-copper alloy contains between about 1 and 15 atomic % chromium. Layer 21 is then planarized, using either chemical mechanical polishing or electropolishing, giving the structure the appearance illustrated in FIG. 3. The relative hardness of the chrome-copper alloy prevents the reappearance of any dishing effects.

Once surface 5 of layer 1 is free of all chrome-copper, planarization is terminated and the inter-metal dielectric (IMD) layer 34 of PEOX (plasma enhanced oxide), PE-TEOS (PE tetra-ethyl orthosilicate), PSG (phosphosilicate glass), or HDP (high density plasma) Oxide is deposited, to a thickness between about 500 and 2,000 Angstroms, as illustrated in FIG. 4. The process used for depositing the IMD was CVD (chemical vapor deposition) or HDP (high density plasma deposition). Because of the availabilty of free oxygen during the deposition process, together with its lower free energy of formation (relative to copper), the chromium component of the chrome-copper alloy is selectively oxidized during the early stages of the JMD deposition, resulting in the formation of a thin layer of chromium oxide 41 at the interface between the copper-chrome and the IMD layer.

Layer 41 of chromium oxide is self-aligned since it forms only over the damascene wiring. Although it is relatively thin (between about 50 and 500 Angstroms under the deposition conditions described above) this is sufficient for it to serve as an effective barrier for the containment of copper.

In an alternative embodiment of the invention, deposition of the IMD layer was followed by an annealing step — heating to a temperature between about 350 and 450° C. for between about 10 and 40 minutes. This enables the layer of chromium oxide to be formed (or its thickness further increased) by leaching oxygen out of the IMD layer.

While the invention has been particularly shown and described with reference to the preferred embodiments thereof, it will be understood by those skilled in the art that various changes in form and details may be made without departing from the spirit and scope of the invention.

What is claimed is:

1. A process to self-passivate copper damascene wiring, comprising:

providing a partially completed integrated circuit, including a top layer of a dielectric wherein a pattern of damascene copper wiring has been formed;

depositing a layer of chrome-copper alloy on said dielectric layer and damascene wiring;

planarizing said layer of chrome-copper alloy thereby eliminating any dishing above the damascene wiring; and depositing a layer of IMD on the layer of chrome-copper alloy thereby forming an interface, between the chrome-copper and the IMD, that comprises a self-aligned barrier.

2. The process of claim 1 wherein the dielectric is selected from the group consisting of PEOX, PE-TEOS, PSG, and HDP Oxide.

3. The process of claim 1 wherein the layer of chrome-copper is deposited by means of chemical vapor deposition or physical vapor deposition or electroplating.

4. The process of claim 1 wherein the layer of chrome-copper is deposited to a thickness between about 500 and 2,000 Angstroms.

5. The process of claim 1 wherein the layer of chrome-copper contains between about 1 and 15 atomic % chromium.

6. The process of claim 1 wherein planarizing said layer of chrome-copper alloy further comprises chemical mechanical polishing or electroplishing.

7. The process of claim 1 wherein the IMD is selected from the group consisting of PEOX, PE-TEOS, PSG, and HDP.

8. The process of claim 7 wherein the layer of IMD is deposited by chemical vapor deposition or by high density plasma deposition.

9. The process of claim 1 wherein the IMD is deposited to a thickness between about 500 and 2,000 Angstroms.

10. The process of claim 1 further comprising annealing said interface at a temperature between about 350 and 450° C. for between about 10 and 40 minutes.

11. A process for forming self-passivated copper damascene wiring, comprising the steps of:

(a) providing a dielectric layer having an upper surface;

(b) patterning and then etching said dielectric layer thereby forming a trench in said upper surface;

(c) patterning and then etching said dielectric layer, including said trench, thereby forming a cavity inside said trench;

(d) depositing a barrier layer on said dielectric layer and on all walls of said trench and said cavity;

(e) depositing a seed layer on said dielectric layer and on all walls of said trench and said cavity;

(f) overfilling said cavity and said trench with copper;

(g) removing the copper and the barrier layer to the level of said upper surface, thereby forming a damscene connector;

(h) depositing a layer of chrome-copper alloy on said dielectric layer and damascene wiring;

(i) planarizing said layer of chrome-copper alloy thereby eliminating any dishing above the damascene wiring; and (j) depositing a layer of IMD on the layer of chrome-copper alloy thereby forming an interface, between the chrome-copper and the IMD, that comprises a self-aligned layer of chromium oxide.

12. The process of claim 11 wherein the layer of chrome-copper is deposited by means of chemical vapor deposition or physical vapor deposition or electroplating.

13. The process of claim 11 wherein the layer of chrome-copper is deposited to a thickness between about 500 and 2,000 Angstroms.

14. The process of claim 11 wherein the layer of chrome-copper contains between about 1 and 10 atomic % chromium.

15. The process of claim 11 wherein planarizing said layer of chrome-copper alloy further comprises chemical mechanical polishing or electroplishing.

16. The process of claim 11 wherein the IMD is selected from the group consisting of PEOX, PE-TEOS, PSG, and HDP.

17. The process of claim 11 wherein the layer of IMD is deposited by chemical vapor deposition or by high density plasma deposition.

18. The process of claim 11 wherein the IMD is deposited to a thickness between about 500 and 2,000 Angstroms.

19. The process of claim 11 further comprising annealing said interface at a temperature between about 350 and 450° C. for between about 10 and 40 minutes.

* * * * *